United States Patent [19]

Bushey et al.

[11] Patent Number: 4,806,796

[45] Date of Patent: Feb. 21, 1989

[54] ACTIVE LOAD FOR EMITTER COUPLED LOGIC GATE

[75] Inventors: Thomas P. Bushey, Phoenix; Bor-Yuan Hwang, Chandler, both of Ariz.

[73] Assignee: Motorola, Inc., Schaumburg, Ill.

[21] Appl. No.: 174,269

[22] Filed: Mar. 28, 1988

[51] Int. Cl.$^4$ ............................................. H03K 19/086
[52] U.S. Cl. ..................... 307/455; 307/290; 307/443; 307/454; 307/362; 307/358
[58] Field of Search ............... 307/455, 358, 362, 363, 307/355, 290, 291, 456, 454, 443

[56] References Cited

U.S. PATENT DOCUMENTS

| | | | |
|---|---|---|---|
| 3,501,647 | 3/1970 | Di Giacomo | 307/455 |
| 3,509,362 | 4/1970 | Bartholomew | 307/455 |
| 3,523,194 | 4/1970 | Sheng | 307/455 |
| 3,787,737 | 1/1974 | Mukai | 307/443 |
| 4,145,623 | 3/1979 | Doucette | 307/289 |
| 4,219,744 | 8/1980 | Shinn, II | 307/290 |
| 4,286,179 | 8/1981 | Konian | 307/455 |
| 4,609,837 | 9/1986 | Yagyuu | 307/455 |

OTHER PUBLICATIONS

Y. H. Chan., "High Speed Current Switch Push-Pull Driver", Oct. 1981, IBM Technical Disclosure Bulletin, vol. 24, No. 5, p. 2635.

Primary Examiner—Stanley D. Miller
Assistant Examiner—Nancy Thai
Attorney, Agent, or Firm—William E. Koch

[57] ABSTRACT

An active load for a CML or ECL logic gate for substantially increasing the speed of the gate comprises a transistor having its base coupled to its collector by a first resistor, and its collector-emitter path coupled in series with a second resistor. This load provides an inductive impedance when the small signal emitter resistance is less than the sum of the resistance of the base and the first resistor, causing a peaking effect resulting in high switching speed.

11 Claims, 3 Drawing Sheets

4,806,796

ACTIVE LOAD FOR EMITTER COUPLED LOGIC GATE

FIELD OF THE INVENTION

This invention relates in general to emitter coupled logic (ECL) gates, and more specifically, to an active load for both CML and ECL gates that substantially increases the speed of the gate.

BACKGROUND OF THE INVENTION

Bipolar logic circuits that provide an output determined by one or more inputs may be designed using one of several circuit techniques, i.e., transistor-transistor logic (TTL), diode-transistor logic (DTL), current mode logic (CML), and emitter-coupled logic (ECL). TTL and DTL are saturated logic circuits, while CML and ECL are non-saturated logic circuits. Consequently, CML and ECL can operate at a higher speed than TTL and DTL by eliminating minority carrier storage time as a speed limiting characteristic. CML gates are similar to ECL gates and typically comprise a pair of differentially coupled transistors having their emitters coupled to a current source. These differentially coupled transistors provide high impedance inputs at their bases, voltage gain within the gate, insignificant power supply noise generation due to the elimination of current spikes, and nearly constant power supply current drain. Emitter follower outputs for the ECL gate restores the logic level and provide low output impedance for good line driving and high fanout capability.

Gate speeds continue to increase periodically due to technological advances in processing as well as market demands for even higher performance devices. Advanced processes have provided for smaller device geometries, improved bandwidth, and reduced parasitic capacitances. However, market demands continue to require increased speed.

Thus, what is needed is an ECL gate having substantially increased speed.

SUMMARY OF THE INVENTION

Accordingly, it is an object of the present invention to provide an improved logic gate.

Another object of the present invention is to provide an improved load for an ECL gate.

Still another object of the present invention is to provide an ECL gate having substantially increased speed.

In carrying out the above and other objects of the invention in one form, there is provided an improved logic gate including a first transistor having a base coupled to a first input terminal, an emitter coupled to a first voltage terminal by a first current source, and a collector coupled to a first output terminal. A second transistor has a base coupled to a second input terminal and emitter coupled to the first voltage terminal by the first current source. A third transistor has its base coupled to its collector by a first resistor, and its collector-emitter path coupled in series with a second resistor between the collector of the first transistor and the second voltage terminal. A fourth transistor has its base coupled to its collector by a third resistor, and its collector-emitter path coupled in series with a fourth resistor between a collector of the second transistor and the second voltage terminal.

The above and other objects, features, and advantages of the present invention will be better understood from the following detailed description taken in conjunction with the accompanying drawings.

DETAILED DESCRIPTION OF THE INVENTION

Figure 1:
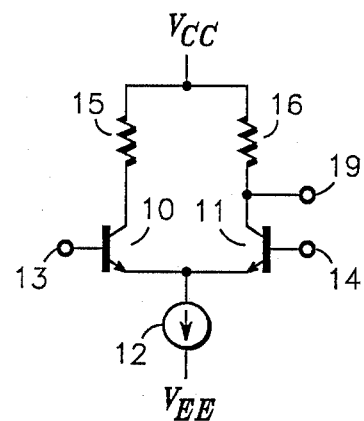
FIG. 1 is a schematic of a previously known resistor loaded CML gate.

Referring to FIG. 1, a conventional current mode logic (CML) gate comprises differentially coupled transistors 10 and 11 having their emitters coupled to a voltage terminal VEE by a current source 12, their bases connected to input terminals 13 and 14, respectively, and their collectors coupled to a voltage terminal $V_{CC}$ by load resistors 15 and 16, respectively. The collector of the transistor 11 is coupled to an output terminal 19. The collector of the transistor 10 may either alternatively or additionally, be connected to another output terminal. Typical simulated gate delays (the time between the input signal transition reaching a specified voltage and the output signal transition reaching the same specified voltage) for the CML gate (advanced double polysilicon bipolar technology) of FIG. 1 for a load voltage of 280 millivolts across either of the resistors 15 or 16 are shown in column A of the following chart. Columns B, C, D and E reflect gate delays for other load type gates discussed hereinafter.

| | PROPAGATION DELAY (picoseconds) | | | | |
|---|---|---|---|---|---|
| | A | B | C | D | E |
| | CML | ECL | ECL | ECL | ECL |
| CURRENT (I) | resistor | resistor | poly diode | pn diode | novel |
| (milliamps) | load | load | load | load | load |
| 0.2 | 185 | 216 | 242 | 195 | 165 |
| 0.4 | 115 | 134 | 162 | 122 | 115 |
| 0.8 | 85 | 100 | 115 | 72 | 72 |
| 1.2 | 80 | 93 | 100 | 60 | 67 |
| 1.6 | 80 | 93 | 92 | 55 | 65 |
| 2.0 | 83 | 95 | 92 | 50 | 60 |
| 2.3 | 85 | 97 | 97 | 47 | 65 |
| 2.5 | 90 | 100 | 97 | 50 | 65 |

Figure 2:
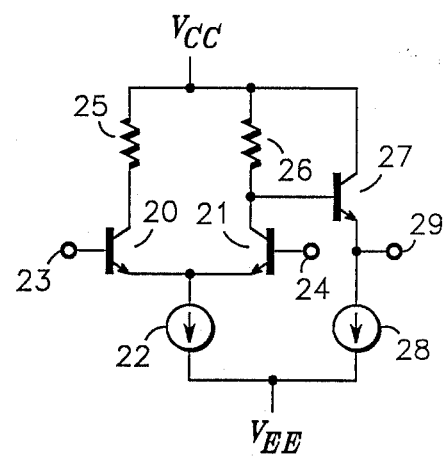
FIG. 2 is a schematic of a previously known resistor loaded ECL gate.

Referring to FIG. 2, a conventional resistor loaded emitter-coupled logic (ECL) gate comprises differentially coupled transistors 20 and 21 having their emitters coupled to a voltage terminal $V_{EE}$ by a current source 22, their bases connected to input terminals 23 and 24, respectively, and their collectors coupled to a voltage terminal $V_{CC}$ by load resistors 25 and 26, respectively. Emitter follower transistor 27 has its emitter coupled to voltage terminal $V_{EE}$ by current source 28 and connected to output terminal 29, its base connected to the collector of transistor 21, and its collector coupled to voltage terminal $V_{CC}$. Simulated gate delays for the ECL gate of FIG. 2 for a load voltage of 500 millivolts across either of the resistors 25 or 26 are shown in column B of the above chart.

Figure 3:
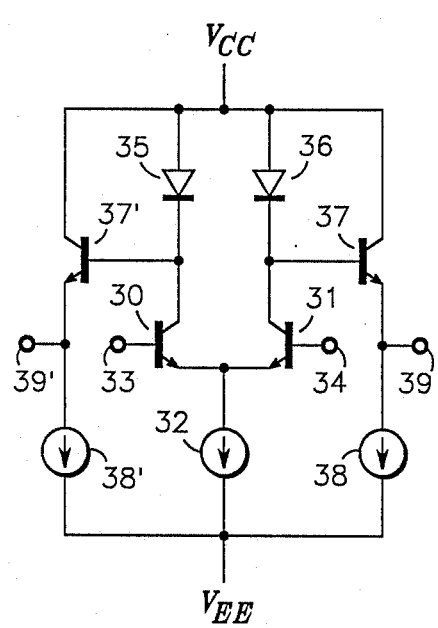
FIG. 3 is a schematic of a previously known polysilicon diode loaded ECL gate.

Referring to FIG. 3, a conventional polysilicon diode loaded ECL gate comprises differentially coupled transistors 30 and 31 having their emitters coupled to a voltage terminal $V_{EE}$ by a current source 32, their bases connected to input terminals 33 and 34, respectively, and their collectors coupled to a voltage terminal $V_{CC}$ by diodes 35 and 36, respectively. Emitter follower transistor 37 has its emitter coupled to voltage terminal $V_{EE}$ by current source 38 and connected to output terminal 39, its base connected to the collector of transistor 31, and its collector coupled to voltage terminal $V_{CC}$. Emitter follower transistor 37' has its emitter coupled to voltage terminal VEE by current source 38' and connected to output terminal 39', its base connected to the collector of transistor 30, and its collector coupled to voltage terminal $V_{CC}$. Simulated gate delays for the ECL gate of FIG. 3 for a load voltage swing of $nv_t \ln B$ millivolts (typically 240 millivolts at 27 degrees Centigrade) across either of the diodes 35 or 36 are shown in column C of the above chart, where n is the ideality factor of the diode, $v_t$ is the thermal voltage of the diode, and ln B is the natural log of the d.c. current gain of the gate transistor.

Figure 4:
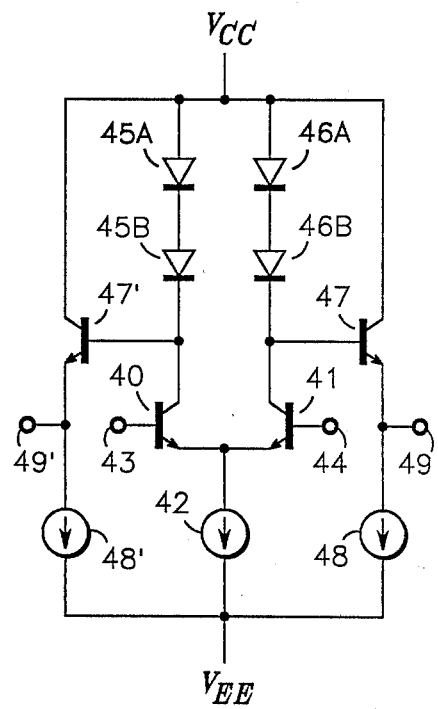
FIG. 4 is a schematic of a previously known pn junction diode loaded ECL gate.

Referring to FIG. 4, a conventional single crystal silicon pn junction diode loaded ECL gate comprises differentially coupled transistors 40 and 41 having their emitters coupled to a voltage terminal $V_{EE}$ by a current source 42, their bases connected to input terminals 43 and 44, respectively, and their collectors coupled to a voltage terminal $V_{CC}$ by diodes 45A, 45B and 46A, 46B, respectively. Emitter follower transistor 47 has its emitter coupled to voltage terminal $V_{EE}$ by current source 48 and connected to output terminal 49, its base connected to the collector of transistor 41, and its collector coupled to voltage terminal $V_{CC}$. Emitter follower transistor 47' has its emitter coupled to voltage terminal $V_{EE}$ by current source 48' and connected to output terminal 49', its base connected to the collector of transistor 40, and its collector coupled to voltage terminal $V_{CC}$. The diode loaded ECL gate of FIG. 4 requires both emitter follower transistors 47 and 47' to balance the voltage level of the gate. Typical simulated gate delays for the ECL gate of FIG. 4 for a load voltage of $2nv_t \ln B$ millivolts (typically 240 millivolts) where n is the ideality factor of a single crystal diode, across either of the diodes 45A, 45B or 46A, 46B are shown in column D of the above chart.

Figure 5:
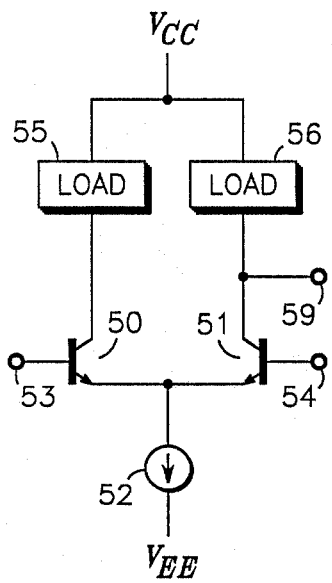
FIG. 5 is a partial block diagram of a first embodiment of the present invention.

In accordance with the present invention, improvements may be made to the loads for the CML gate of FIG. 1 or the ECL gates of FIGS. 2, 3 and 4 by the substitution of a new and improved load. Referring to FIG. 5, the improved CML gate comprises differentially coupled transistors 50 and 51 having their emitters coupled to a voltage terminal $V_{EE}$ by a current source 52, their bases connected to input terminals 53 and 54, respectively, and their collectors coupled to a voltage terminal $V_{CC}$ by loads 55 and 56, respectively. Input terminals 53 and 54 would be coupled to receive either first and second input signals, respectively, or one would receive an input signal and the other a reference voltage. Output terminal 59 is connected to the collector of transistor 51.

Figure 6:
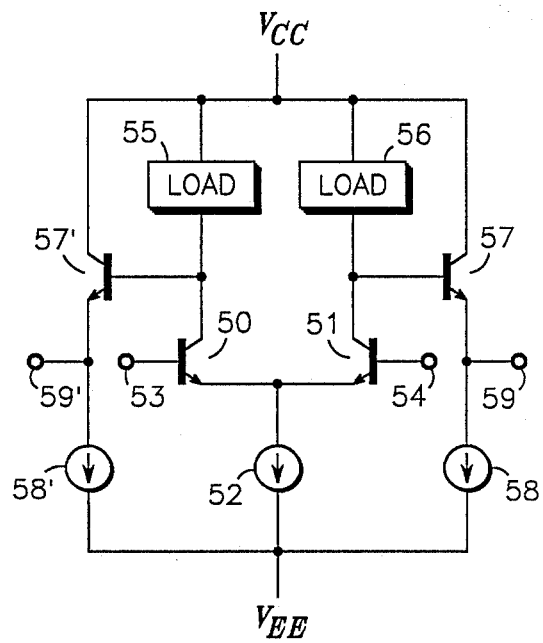
FIG. 6 is a partial block diagram of a second embodiment of the present invention.

Referring to FIG. 6, the improved ECL gate is similar to the CML gate but comprises additional emitter follower transistor 57 having its emitter coupled to voltage terminal $V_{EE}$ by current source 58 and connected to output terminal 59, its base connected to the collector of transistor 51, and its collector coupled to voltage terminal $V_{CC}$. Emitter follower transistor 57' has its emitter coupled to voltage terminal $V_{EE}$ by current source 58' and connected to output terminal 59', its base connected to the collector of transistor 50, and its collector coupled to voltage terminal $V_{CC}$. Emitter follower transistor 57' and current source 58' and load 55 are optional when a single output is desired.

Figure 7:
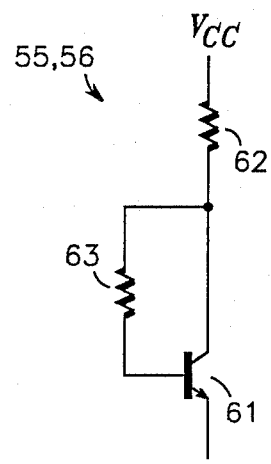
FIG. 7 is a schematic of one type of load for the preferred embodiment of the present invention.
Figure 8:
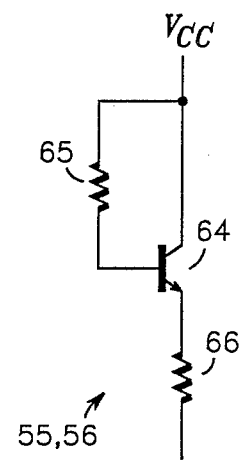
FIG. 8 is a schematic of another type of load for the preferred embodiment of the present invention.

The loads 55 and 56 may comprise either the load shown in FIG. 7 or the load shown in FIG. 8. Referring to FIG. 7, the transistor 61 has its emitter connected to the collector of transistor 50, its collector coupled to voltage terminal $V_{CC}$ by resistor 62, and its base coupled to its collector by resistor 63. Referring to FIG. 8, the transistor 64 has its emitter connected to the collector of transistor 50 by resistor 65, its base coupled to voltage terminal $V_{CC}$ by resistor 65, and its collector coupled to voltage terminal $V_{CC}$. Simulated gate delays for the ECL gate of FIG. 6 for a load voltage of approximately 400 millivolts across either of the loads 55 or 56 are shown in column E of the above chart.

Comparing the propagation delay for each of the previously known circuits with the delay obtained for the loads of FIGS. 7 and 8 reflect that the improved load of the present invention results in a substantially improved gate delay over the CML gate, the resistor loaded ECL gate and the polysilicon diode loaded ECL gate. The load 55 or 56 provides a frequency dependent impedance, described further hereinafter, that is absent from the resistor load and polysilicon diode load ECL gates. Thus, the resistor loaded ECL gate and the polysilicon diode loaded ECL gate will have slower rise and fall signal transition times, thus a slower gate delay. The pn junction diode load ECL gate gives extremely fast speed; however, limitations such as voltage swing, differential drive, large voltage drop on load elements, and an increased number of signal lines on the chip result in the pn junction diode load ECL gate not being suitable for many applications.

The collector-base shorted diode in series with a resistor provides an inductive impedance at high frequency. This provides a peaking effect that results in fast rise and fall signal transition edges and high switching speed.

Referring to FIG. 8 for example, the impedance $Z_o$ looking into the emitter of transistor 64 is expressed by the equation as follows:

$$Z_o = \frac{R_{BT}(S + (1/(C_\pi(r_\pi R_{BT}/(r_\pi + R_{BT})))))}{S + 1/(C_\pi r_e)}$$

where $R_{BT}$ equals the sum of the resistance of resistor 65 and the base of transistor 64, S equals the complex frequency $j\omega$, $C_\pi$ equals the summation of the emitter junction capacitance and the diffusion capacitance, $r_\pi$ is the input impedance, and $r_e$ is the small signal emitter resistance (thermal voltage divided by collector current).

Assuming that $R_{BT} << r_\pi$ just for the purpose of explanation, and noting that the unit gain frequency $\omega_T$ is approximately $1/(C_\pi r_e)$, the above equation simplifies to:

$$Z_o = \frac{R_{BT}(S + (r_e/R_{BT})(\omega_T))}{S + \omega_T}$$

Figure 9:
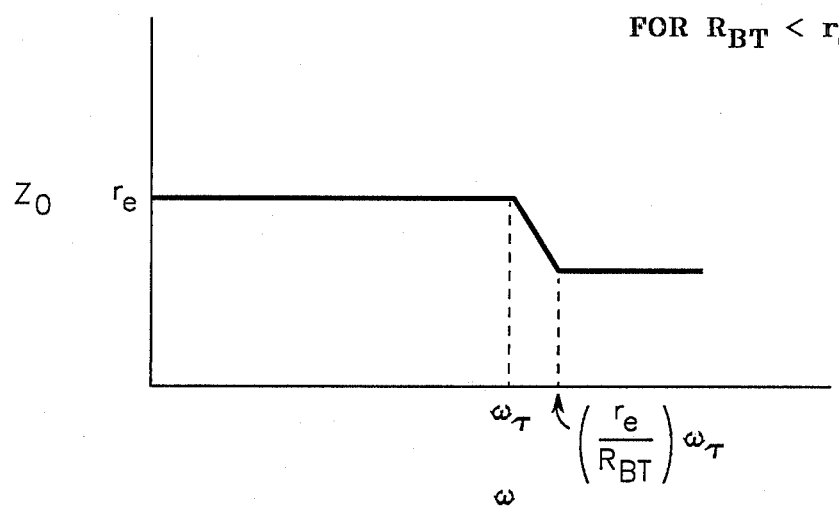
FIG. 9 is a graph illustrating the frequency dependent impedance for a load having capacitive characteristics.
Figure 10:
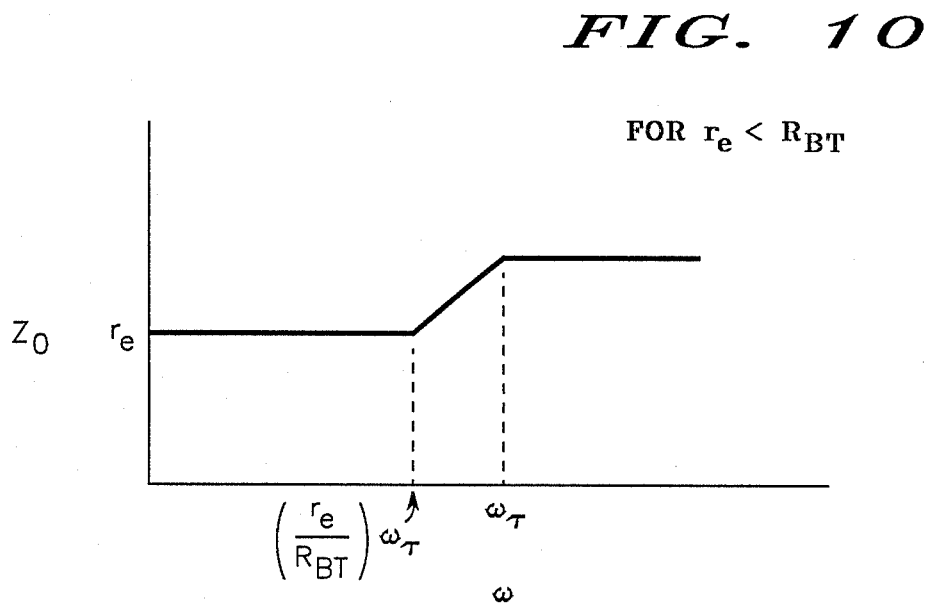
FIG. 10 is a graph illustrating the frequency dependent impedance for a load having inductive characteristics in accordance with the present invention.

Thus, if $R_{BT} < r_e$, then the load becomes capacitive as shown in FIG. 9. However, if $r_e < R_{BT}$, then the load becomes inductive as shown in FIG. 10, providing the desired results.

By now it should be appreciated that there has been provided an improved load for CML and ECL gates that substantially increases the speed of the gate.

We claim

1. An improved logic gate having first and second voltage terminals, first and second input terminals, a first output terminal, a first current source, a first transistor having a base coupled to said first input terminal, an emitter coupled to said first voltage terminal by said first current source, and a collector coupled to said first output terminal, and a second transistor having a base coupled to said second input terminal, an emitter coupled to said first voltage terminal by said first current source, and having a collector, said improvement comprising:
   a first resistor;
   a second resistor;
   a third resistor;
   a fourth resistor;
   a third transistor having its base coupled to its collector by said first resistor, and its collector-emitter path coupled in series with said second resistor between said collector of said first transistor and said second voltage terminal; and
   a fourth transistor having its base coupled to its collector by said third resistor, and its collector-emitter path coupled in series with said fourth resistor between said collector of said second transistor and said second voltage terminal.

2. The improved logic gate according to claim 1 further comprising:
   a second output terminal;
   first means coupled between said collector of said first transistor and said first output terminal for amplifying the voltage on said collector of said first transistor; and
   second means coupled between said collector of said second transistor and said second output terminal for amplifying the voltage on said collector of said second transistor.

3. The improved logic gate according to claim 1 further comprising:
   a second output terminal;
   a second current source;
   a third current source;
   a fifth transistor coupled between said collector of said first transistor and said first output terminal having a collector coupled to said second voltage terminal, a base coupled to the collector of said first transistor, and an emitter coupled to said first output terminal and coupled to said first voltage terminal by said second current source; and
   a sixth transistor having a collector coupled to said second voltage terminal, a base coupled to the collector of said second transistor, and an emitter coupled to said second output terminal and coupled to said first voltage terminal by said third current source.

4. A logic gate comprising:
   a first supply voltage terminal;
   a second supply voltage terminal;
   a first input terminal;
   a second input terminal;
   a first output terminal;
   a first current source;
   a first resistor;
   a second resistor;
   a third resistor;
   a fourth resistor;
   a first transistor having a base coupled to said first input terminal, an emitter coupled to said second supply voltage terminal by said first current source, and a collector to said first output terminal;
   a second transistor having a base coupled to said second input terminal, an emitter coupled to said second supply voltage terminal by said first current source, and a collector;
   a third transistor having its base coupled to its collector by said first resistor, and its collector-emitter current path coupled in series with said second resistor between said collector of said first transistor and said first supply voltage terminal; and
   a fourth transistor having its base coupled to its collector by said third resistor, and its collector-emitter current path coupled in series with said fourth resistor between said collector of said second transistor and said first supply voltage terminal.

5. The logic gate according to claim 4 further comprising:
   a second output terminal;
   first means coupled between said collector of said first transistor and said first output terminal for amplifying the voltage on said collector of said first transistor; and
   second means coupled between said collector of said second transistor and said second output terminal for amplifying the voltage on said collector of said second transistor.

6. The improved logic gate according to claim 4 further comprising:
   a second output terminal;
   a second current source;
   a third current source;
   a fifth transistor having a collector coupled to said second voltage terminal, a base coupled to the collector of said first transistor, and an emitter coupled to said first output terminal and coupled to said first voltage terminal by said second current source; and
   a sixth transistor having a collector coupled to said second voltage terminal, a base coupled to the collector of said second transistor, and an emitter coupled to said second output terminal and coupled to said first voltage terminal by said third current source.

7. An logic gate comprising:
   a first supply voltage terminal;
   a second supply voltage terminal;
   a first input terminal;
   a second input terminal;
   a first output terminal;
   a first current source;
   a first resistor;
   a second resistor;

a first transistor having a base coupled to said first input terminal, an emitter coupled to said second supply voltage terminal by said first current source, and a collector;

a second transistor having a base coupled to said second input terminal, an emitter coupled to said second supply voltage terminal by said first current source, and a collector;

a third transistor having its base coupled to its collector by said first resistor, and its collector-emitter current path coupled in series with said second resistor between said collector of said first transistor and said second supply voltage terminal; and first means coupled between said collector of said first transistor and said first output terminal for amplifying the voltage on said collector of said first transistor.

8. The logic gate according to claim 7 wherein said first means comprises:

a second current source; and a fourth transistor having a collector coupled to said second voltage terminal, a base coupled to the collector of said first transistor, and an emitter coupled to said first output terminal and coupled to said first voltage terminal by said second current source.

9. The logic gate according to claim 7 further comprising:

a second output terminal;

a third resistor;

a fourth resistor; and a fourth transistor having its base coupled to its collector by said third resistor, and its collector-emitter current path coupled in series with said fourth resistor between said collector of said second transistor and said second supply voltage terminal; and second means coupled between said collector of said second transistor and said second output terminal for amplifying the voltage on said collector of said second transistor.

10. The logic gate according to claim 9 wherein said second means comprises:

a third current source; and a sixth transistor having a collector coupled to said second voltage terminal, a base coupled to the collector of said second transistor, and an emitter coupled to said second output terminal and coupled to said first voltage terminal by said third current source.

11. The improved logic gate according to claim 1 wherein the small signal emitter resistance of said third transistor is less in magnitude than the sum of the resistances of said first resistor and the base of said third transistor and the small signal emitter resistance of said fourth transistor is less in magnitude than the sum of the resistances of said second resistor and the base of said fourth transistor.

* * * * *